(12) United States Patent
Umeda et al.

US011805663B2

(10) Patent No.: US 11,805,663 B2
(45) Date of Patent: Oct. 31, 2023

(54) LIGHT EMITTING DEVICE AND DISPLAY DEVICE

(71) Applicant: SHARP KABUSHIKI KAISHA, Sakai (JP)

(72) Inventors: Tokiyoshi Umeda, Sakai (JP); Yuto Tsukamoto, Sakai (JP); Bai Zhang, Sakai (JP); Shinichi Kawato, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 684 days.

(21) Appl. No.: 16/982,444

(22) PCT Filed: Mar. 27, 2018

(86) PCT No.: PCT/JP2018/012556
§ 371 (c)(1),
(2) Date: Sep. 18, 2020

(87) PCT Pub. No.: WO2019/186717
PCT Pub. Date: Oct. 3, 2019

(65) Prior Publication Data
US 2021/0083218 A1   Mar. 18, 2021

(51) Int. Cl.
*H10K 50/125*   (2023.01)
*H10K 50/11*   (2023.01)
*H10K 85/30*   (2023.01)
*H10K 85/60*   (2023.01)
*H10K 101/10*   (2023.01)
*H10K 101/00*   (2023.01)

(52) U.S. Cl.
CPC .......... *H10K 50/125* (2023.02); *H10K 50/11* (2023.02); *H10K 85/322* (2023.02); *H10K 85/342* (2023.02); *H10K 85/654* (2023.02); *H10K 85/6572* (2023.02); *H10K 85/6574* (2023.02); *H10K 2101/10* (2023.02); *H10K 2101/27* (2023.02)

(58) Field of Classification Search
CPC .... H10K 50/125; H10K 50/13; H10K 50/135; H10K 50/14; H10K 50/15; H10K 50/16; H10K 50/165; H10K 85/322; H10K 85/654; H10K 2101/10; H10K 85/342; H10K 85/6574; H10K 85/6572; H10K 2101/27
See application file for complete search history.

(56) References Cited

U.S. PATENT DOCUMENTS

| 2017/0018600 | A1 | 1/2017 | Ito et al. | |
| 2017/0186993 | A1* | 6/2017 | Hamada | H10K 50/814 |
| 2018/0375058 | A1 | 12/2018 | Kawamura et al. | |
| 2019/0393273 | A1* | 12/2019 | Umezu | H05B 33/14 |

FOREIGN PATENT DOCUMENTS

| JP | 2016-207328 A | 12/2016 |
| WO | 2017/099160 A1 | 6/2017 |

* cited by examiner

*Primary Examiner* — Brook Kebede
(74) *Attorney, Agent, or Firm* — ScienBiziP, P.C.

(57) ABSTRACT

A light-emitting device or the like with high color reproducibility and high luminous efficiency is achieved. The light-emitting device includes a blue pixel, a green pixel, and a red pixel, and the green pixel includes, in a green-light-emitting layer that emits light, a host material that transports carriers, a fluorescence dopant, which serves as a light emission dopant that contribute to light emission, and a thermally activated assist dopant which is composed of a thermally activated delayed fluorescent material.

10 Claims, 7 Drawing Sheets

LIGHT EMITTING DEVICE AND DISPLAY DEVICE

TECHNICAL FIELD

The disclosure relates to a light-emitting device and a display device including the light-emitting device.

BACKGROUND ART

PTL 1 discloses an organic electroluminescence (EL) element including at least three electrodes and at least two light-emitting units sandwiched by the electrodes. The light-emitting units in the organic EL element include a light-emitting layer including a luminescent material. In the light-emitting layer, recombination of electrons and holes generates excitons with higher energy levels than the ground level, and radiative transition of the excitons to the ground level causes light emission.

CITATION LIST

Patent Literature

PTL 1: JP 2016-207328 A (published on Dec. 8, 2016)

SUMMARY

Technical Problem

In general, light emission spectrum width of a phosphorescence dopant is wider compared to that of a fluorescence dopant. Thus, in an electroluminescence element including the phosphorescence dopant utilizing a cavity of light reflection by an anode and a cathode, the color drift at an angle deviated from the front is large.

On the other hand, the light emission by the fluorescence dopant has theoretically a low value of 25% for the maximum internal quantum efficiency that indicates the ratio of the number of excitons that contribute to the light emission to the number of generated excitons. The maximum external quantum efficiency (luminous efficiency) in the electroluminescence element is proportional to the maximum internal quantum efficiency. Thus, the electroluminescence element including the fluorescence dopant has a problem in that the luminous efficiency is low.

An object of one aspect of the disclosure is to achieve a light-emitting device and the like which has high color reproducibility and high luminous efficiency.

Solution to Problem

In order to solve the above-described problem, a light-emitting device according to one aspect of the disclosure includes n (n is a natural number of 2 or greater) electroluminescence elements configured to emit lights having light emission spectra of peak wavelengths different from each other. Each of the n electroluminescence elements includes a light-emitting layer configured to emit light, the light-emitting layer includes a host material configured to transport carriers, and a light emission dopant configured to contribute to the light emission, and m ($1 \leq m \leq n-1$) of the n electroluminescence elements include, in the light-emitting layer, a fluorescence dopant configured to serve as the light emission dopant, and further include a thermally activated assist dopant composed of a thermally activated delayed fluorescent material.

Advantageous Effects of Disclosure

According to the light-emitting device according to one aspect of the disclosure, a light-emitting device which has high color reproducibility and high luminous efficiency, and the like can be achieved.

DESCRIPTION OF EMBODIMENTS

First Embodiment

Figure 2:
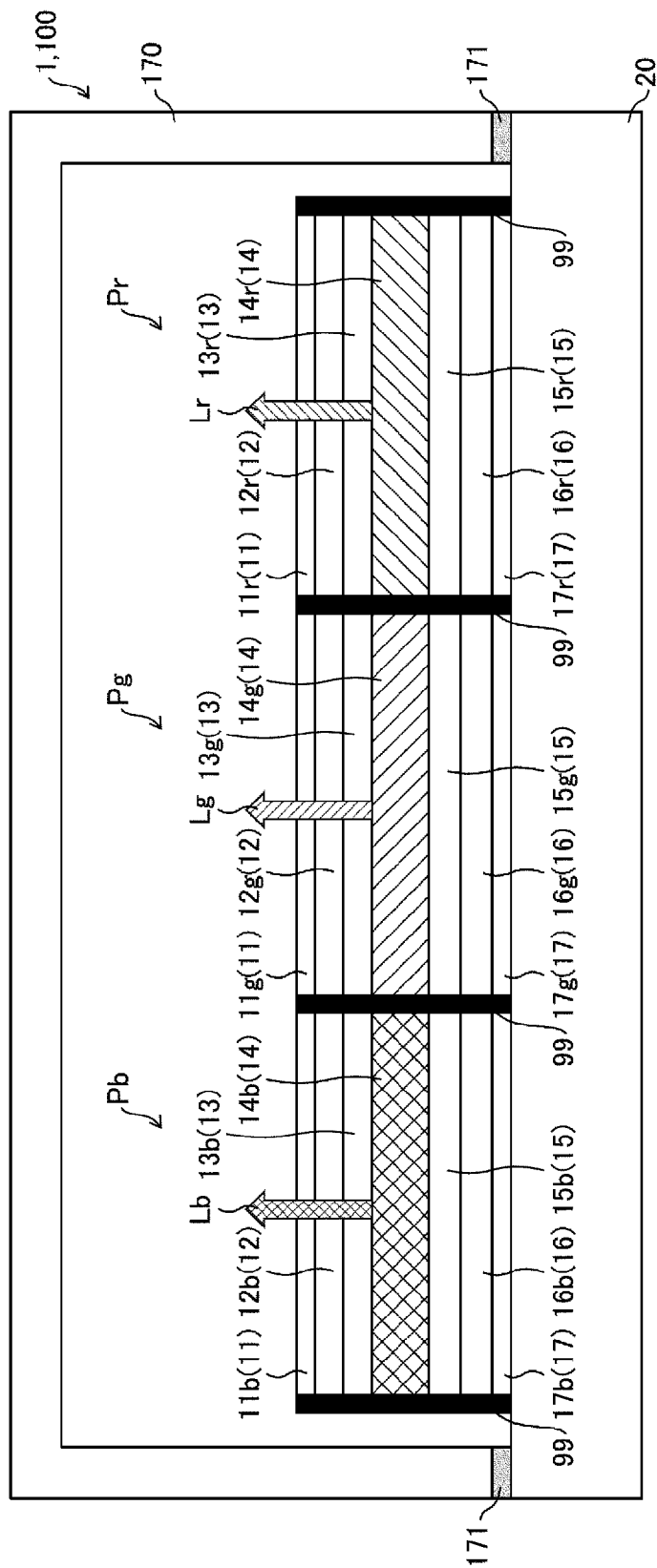
FIG. 2 is a cross-sectional view illustrating a schematic configuration of the light-emitting device of the first embodiment.

FIG. 2 is a cross-sectional view illustrating a schematic configuration of the light-emitting device 1 of the first embodiment. A light-emitting device 1 is used as a light source of a display device 100. That is, the display device 100 includes the light-emitting device 1 as a light source. Note that although only one light-emitting device 1 included in the display device 100 is illustrated in FIG. 2, in practice, the display device 100 includes a plurality of light-emitting devices 1. Of the members included in the light-emitting device 1, the description of members not related to the first embodiment will be omitted. It may be understood that the members descriptions of which are omitted are similar to those known in the art. Further, note that each drawing schematically describes the shape, structure, and positional relationship of each member, and is not necessarily drawn to scale.

Configuration of Light-Emitting Device 1

The light-emitting device 1 is a light source that lights each pixel of the display device 100. In the first embodiment, the display device 100 expresses an image with a plurality of pixels of Red, Green, and Blue (RGB). Hereinafter, a blue pixel (a B pixel or a first electroluminescence element) is referred to as Pb, a green pixel (a G pixel or a second electroluminescence element) is referred to as Pg, and a red pixel (an R pixel or a third electroluminescence element) is referred to as Pr.

In the light-emitting device 1, each of the red pixel Pr, the green pixel Pg, and the blue pixel Pb may be divided by a light blocking member 99 (e.g. a black matrix). By dividing each pixel by the light blocking member 99, the outline of each pixel is emphasized. Therefore, the contrast of the image displayed on the display surface (not illustrated) of the display device 100 is improved.

In the light-emitting device 1, a direction from the anode electrode 17 to the cathode electrode 11 is referred to as an upward direction. A direction opposite to the upward direction is referred to as a downward direction. The light-emitting device 1 includes the anode electrode 17, a Hole Injection Layer (HIL) 16, a Hole Transportation layer (HTL) 15, a light-emitting layer 14, an Electron Transportation Layer (ETL) 13, an Electron Injection Layer (EIL) 12, and the cathode electrode 11, in this order from the anode electrode 17 in the upward direction.

From the cathode electrode 11 to the anode electrode 17 are supported by the substrate 20 provided below the anode electrode 17. As an example, when manufacturing the light-emitting device 1, the anode electrode 17, the hole injection layer 16, the hole transportation layer 15, the light-emitting layer 14, the electron transportation layer 13, the electron injection layer 12 and the cathode electrode 11 are formed (film formation) on the substrate 20 in this order. As illustrated in FIG. 2, a blue pixel Pb, a green pixel Pg, and a red pixel Pr are arranged without overlapping each other in a direction parallel to the substrate 20.

The substrate 20 may be a highly transparent substrate (e.g. a glass substrate or a plastic substrate), or a substrate with a poorly transparent (e.g. a flexible substrate or a metal substrate). The light-emitting device 1 further includes a sealing glass 170 that seals (protects) from the cathode electrode 11 to the anode electrode 17. The sealing glass 170 is fixed to the substrate 20 by a sealing resin 171 (e.g. adhesive). Note that instead of the sealing glass 170, the light-emitting device 1 may include a sealing film such as a Thin Film Encapsulation (TFE) film, for example.

From the cathode electrode 11 to the anode electrode 17 may be individually provided for each of the blue pixel Pb, the green pixel Pg, and the red pixel Pr. For example, the cathode electrode 11 includes a cathode electrode 11b provided in the blue pixel Pb, a cathode electrode 11g provided in the green pixel Pg, and a cathode electrode 11r provided in the red pixel Pr.

In this way, in FIG. 2, the subscripts "b, g, r" are appended to distinguish the members corresponding to the blue pixel Pb, the green pixel Pg, and the red pixel Pr, as necessary. This is true for the electron injection layer 12 (12b, 12g, and 12r), the electron transportation layer 13 (13b, 13g, and 13r), the light-emitting layer 14 (14b, 14g, and 14r), the hole transportation layer 15 (15b, 15g, and 15r), the hole injection layer 16 (16b, 16g, and 16r), and the anode electrode 17 (17b, 17g, and 17r).

Configuration Other Than Light-Emitting Layer 14

In the first embodiment, the cathode electrode 11 (cathode) is formed by a translucent Mg—Ag alloy, for example. That is, the cathode electrode 11 is a light-transmissive electrode that transmits light emitted from the light-emitting layer 14. Thus, among the lights emitted from the light-emitting layer 14, the light going upward is transmitted through the cathode electrode 11. In this way, the light-emitting device 1 can emit the light emitted from the light-emitting layer 14 in the upward direction.

In contrast, the anode electrode 17 (anode) has a configuration in which Indium Tin Oxide (ITO) is layered on the Ag—Pd—Cu alloy, for example. The anode electrode 17 having the above-described configuration is a reflective electrode that reflects lights (blue light Lb, green light Lg, and red light Lr) emitted from the light-emitting layer 14. Thus, among the lights emitted from the light-emitting layer 14, the light going downward (not illustrated) is reflected by the anode electrode 17.

As described above, in the light-emitting device 1, both the light emitted in the upward direction and the light emitted in the downward direction from the light-emitting layer 14 can be directed toward the cathode electrode 11 (upward direction). That is, the light-emitting device 1 is configured as a top-emission type light-emitting device utilizing a cavity of light reflection by the anode and the cathode. Thus, the usage efficiency of the light emitted from the light-emitting layer 14 can be improved. Note that the above-described configuration of the cathode electrode 11 and the anode electrode 17 is an example, and may have another configuration.

The electron transportation layer 13 contains a material with excellent electron transportation property. According to the electron transportation layer 13, the supply of electrons from the cathode electrode 11 to the light-emitting layer 14 can be promoted. The electron transportation layer 13 may also have a role of the Electron Injection Layer (EIL). The hole injection layer 16 is a layer that promotes injection of holes from the anode electrode 17 to the light-emitting layer 14. The hole injection layer 16 contains a material having excellent hole injection property. The hole transportation layer 15 contains a material with excellent hole transportation property. According to the hole injection layer 16 and the hole transportation layer 15, the supply of holes from the anode electrode 17 to the light-emitting layer 14 can be promoted.

By applying a forward voltage between the anode electrode 17 and the cathode electrode 11 (by setting the anode electrode 17 to a potential higher than that of the cathode electrode 11), (i) electrons can be supplied from the cathode electrode 11 to the light-emitting layer 14 and (ii) holes can be supplied from the anode electrode 17 to the light-emitting layer 14. As a result, in the light-emitting layer 14, light can be generated as a result of a combination of holes and electrons. The above-described application of the voltage may be controlled by a Thin Film Transistor (TFT) (not illustrated).

Configuration of Light-Emitting Layer 14

Figure 1:
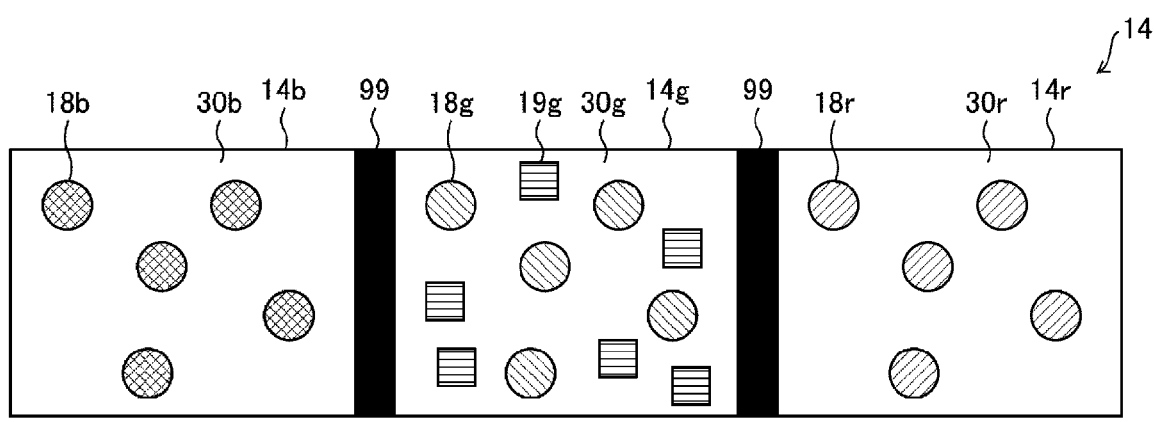
FIG. 1 is a cross-sectional view illustrating a detailed configuration of a light-emitting layer included in a light-emitting device of a first embodiment.

FIG. 1 is a cross-sectional view illustrating a detailed configuration of the light-emitting layer 14 included in the light-emitting device 1. Note that the aspect ratio of the light-emitting layer 14 in the plane of the paper in FIG. 1 is different from the aspect ratio of the light-emitting layer 14 in the plane of the paper in FIG. 2. The aspect ratios are only changed in consideration of the ease of view, and in practice, the light-emitting layer 14 in FIG. 1 and the light-emitting layer 14 in FIG. 2 are the same as each other.

The light-emitting layer 14 includes the blue-light-emitting layer 14b provided in the blue pixel Pb, the green-light-emitting layer 14g provided in the green pixel Pg, and the red-light-emitting layer 14r provided in the red pixel Pr. The blue-light-emitting layer 14b, the green-light-emitting layer 14g, and the red-light-emitting layer 14r respectively include host materials 30b, 30g and 30r that transport the carriers and the light emission dopants 18b, 18g and 18r that contribute to light emission. The light emission dopants generate excitons as a result of the combination of holes supplied from the anode electrode 17 and electrons supplied from the cathode electrode 11, and emit light when the excitons transit to a ground state.

The blue-light-emitting layer 14b includes a fluorescence dopant, which serves as the light emission dopant 18b that emits blue light. The fluorescence dopant may be, for example, 4,4'-Bis (2,2-diphenylvinyl)biphenyl (DPVBi). In this case, the blue light emitted by the blue-light-emitting layer 14b exhibits a light emission spectrum having a peak at or near 445 nm.

The host material 30b of the blue-light-emitting layer 14b may be, for example, adamantane anthracene as a Triplet-Triplet Annihilation (TTA) host material. The TTA host material generates one singlet exciton from two triplet excitons by the TTA, and the light emission as delayed fluorescence is obtained from the singlet exciton of the fluorescence dopant by energy transfer. The mass ratio of the fluorescence dopant to the mass of the entire blue-light-emitting layer 14b may be, for example, 3 wt. %.

The green-light-emitting layer 14g includes a fluorescence dopant that emits green light, which serves as the light emission dopant 18g. The fluorescence dopant may be, for example, N, N'-Difluoroboryl-1,9-dimethy-5-phenydipyrrin (Bodipy). In this case, the green light emitted by the green-light-emitting layer 14g exhibits a light emission spectrum having a peak at or near 520 nm.

The green-light-emitting layer 14g further includes a thermally activated assist dopant 19g. The thermally activated assist dopant 19g is configured by using a Thermally Activated Delayed Fluorescence (TADF) material. Specifically, the thermally activated assist dopant 19g may be, for example, 3-(9,9-dimethylacridin-10(9H)-yl)-9H-xanthen-9-one (ACRXTN).

In the green-light-emitting layer 14g, the host material 30g may be, for example, 1,3-di-9-carbazolylbenzene (mCP). The mass ratio of the fluorescence dopant to the mass of the entire green-light-emitting layer 14g including the thermally activated assist dopant 19g is preferably within a range of 0.1 wt. % or greater and 20 wt. % or less, and more preferably within a range of 0.5 wt. % or greater and 10 wt. % or less. More specifically, the mass ratio of the fluorescence dopant to the mass of the entire green-light-emitting layer 14g may be, for example, 1 wt. %. Furthermore, the mass ratio of the thermally activated assist dopant to the mass of the entire green-light-emitting layer 14g is preferably within a range of 0.5 wt. % or greater and 70 wt. % or less, and more preferably within a range of 1 wt. % or greater and 50 wt. % or less.

The red-light-emitting layer 14r includes a phosphorescence dopant that emits red light, which serves as the light emission dopant 18r. The phosphorescence dopant may be, for example, Bis-(3-(2-(2-pyridyl)benzothienyl)mono-acetylacetonate)iridium(III)) (Btp2Ir(acac)). In this case, the red light emitted by the red-light-emitting layer 14r exhibits a light emission spectrum having a peak at or near 620 nm.

In the red-light-emitting layer 14r, the host material 30r may be, for example, 4,4'-Bis(carbazole-9-yl)-2,2'-dimethylbiphenyl (CDBP). The mass ratio of the phosphorescence dopant to the mass of the entire red-light-emitting layer 14r may be 10 wt. %, for example.

Figure 3:
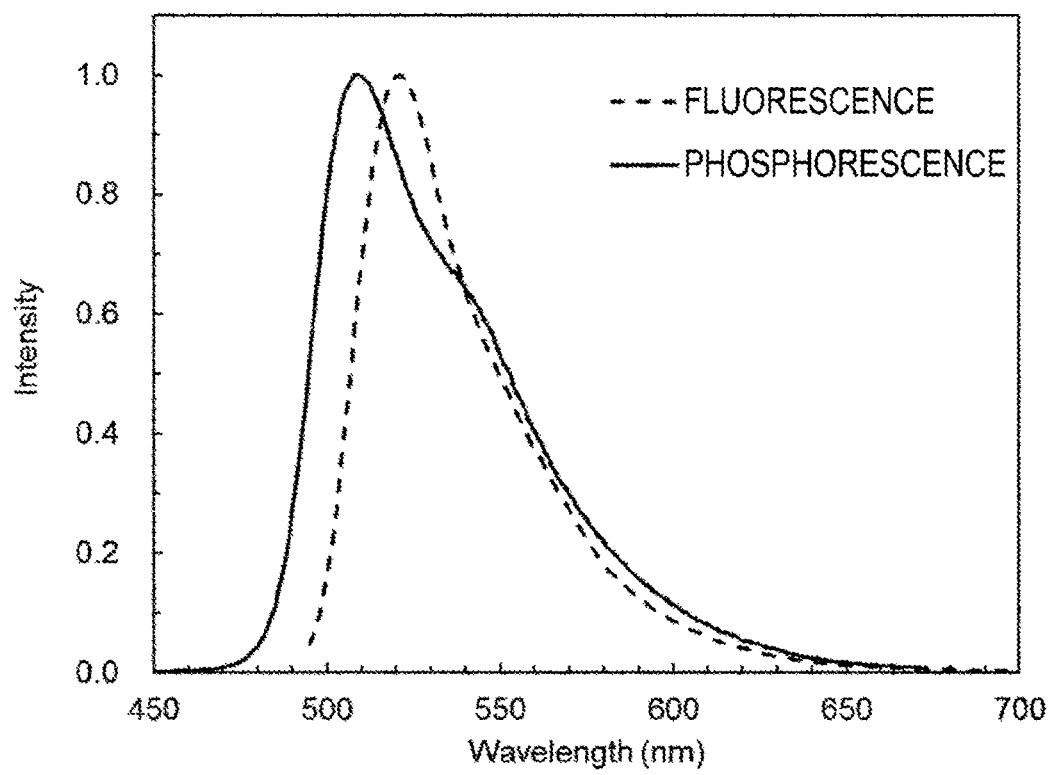
FIG. 3 is a graph illustrating a light emission spectrum of a light emission dopant that emits green light.

FIG. 3 is a graph illustrating the light emission spectrum of the light emission dopant that emits green light. In FIG. 3, the light emission spectrum of the phosphorescence dopant that emits green light is indicated by a solid line. In FIG. 3, the light emission spectrum of the fluorescence dopant that emits green light is indicated by a dashed line.

As illustrated in FIG. 3, in general, the light emission spectrum peak of the fluorescence dopant is sharper than the light emission spectrum peak of the phosphorescence dopant.

When the light emission spectrum width is narrow, the color drift in the front and oblique directions with respect to the light-emitting device is suppressed in the top-emission type electroluminescence element utilizing the cavity of light reflection by the anode electrode and the cathode electrode. Thus, in order to improve the color reproducibility including not only the front but also the oblique of the light-emitting device, it is preferable to use the fluorescence dopant having a narrow spectral width, which serves as the light emission dopant.

However, the maximum internal quantum efficiency of the phosphorescence dopant is theoretically 100%, whereas the maximum internal quantum efficiency of the fluorescence dopant is theoretically only 25%. The reason is as follows.

There are two types of energy levels of excitons, i.e. a singlet level and a triplet level. The process of radiative transition from the singlet level to the ground level is referred to as fluorescence. On the other hand, the process of radiative transition from the triplet level to the ground level is referred to as phosphorescence. In the case of organic molecules, the generation probability of the excitons of the singlet level is 25%. On the other hand, the generation probability of the excitons of the triplet level is 75%.

The phosphorescence dopant can use both of the excitons of the singlet level and triplet level for the light emission. On the other hand, the fluorescence dopant can use only the excitons of the singlet level for the light emission. As a result, the phosphorescence dopant and the fluorescence dopant result in difference in the above-described maximum internal quantum efficiency.

The final luminous efficiency of the electroluminescence element is proportional to the maximum internal quantum efficiency. Thus, in general, when the fluorescence dopant is used as the light emission dopant, the luminous efficiency is reduced.

In the green-light-emitting layer 14g of the present embodiment, however, in the thermally activated assist dopant, intersystem crossing of the excitons of the triplet level to the singlet level occurs by an energy of about room temperature. As a result, the excitons excited to the triplet level are also possible to contribute to the light emission in the fluorescence dopant by intersystem crossing to the singlet level and energy transfer to the singlet level of the fluorescence dopant. Thus, in the green-light-emitting layer 14g, all of the generated excitons will ultimately contribute to the light emission. Thus, the maximum internal quantum efficiency of the green-light-emitting layer 14g is theoretically 100% and the ultimate luminous efficiency is also improved.

Effect of Light-Emitting Device 1

As described above, the light-emitting device 1 of the present embodiment includes the green pixel Pg that is capable of allowing the fluorescence dopant having a narrow half-value width of the light emission spectrum to emit light with high internal quantum efficiency. Accordingly, the light-emitting device 1 can achieve both an improvement in the color reproducibility and an improvement in the luminous efficiency.

Note that the number of pixels (electroluminescence elements) included in the light-emitting device 1 is not limited to three. That is, the light-emitting device 1 may include n (n is a natural number of 2 or greater) pixels that emit lights having emission spectra of peak wavelengths different from each other. In this case, m (1≤m≤n−1) pixels of then pixels may include, in the light-emitting layer, the fluorescence dopant and further include the thermally activated assist dopant.

Modification Example

In the example described above, the blue-light-emitting layer 14b includes a fluorescence dopant, which serves as the light emission dopant. In one aspect of the present disclosure, however, the blue-light-emitting layer may include a phosphorescence dopant, which serves as the light emission dopant. In a case where the blue-light-emitting layer includes the phosphorescence dopant as the light emission dopant, the phosphorescence dopant may be, for example, Bis(3,5-difluoro-2-(2-pyridylphenyl-(2-carboxy-pyridyl)iridium (III) (FIrpic). In this case, the blue light emitted by the blue-light-emitting layer exhibits a light emission spectrum having a peak at or near 470 nm.

In a case where the blue-light-emitting layer includes the phosphorescence dopant as the light emission dopant, the host material 30b of the blue-light-emitting layer may be, for example, mCP. In this case, the mass ratio of the phosphorescence dopant to the mass of the entire blue-light-emitting layer may be, for example, 10 wt. %. The light-emitting device including such a blue-light-emitting layer also exhibits the same effect as the light-emitting device 1 described above.

Second Embodiment

Another embodiment of the disclosure will be described below. Note that, for the convenience of description, members having the same functions as the members described in the foregoing embodiment will be given the same reference signs, and descriptions thereof will not be reiterated.

Figure 4:
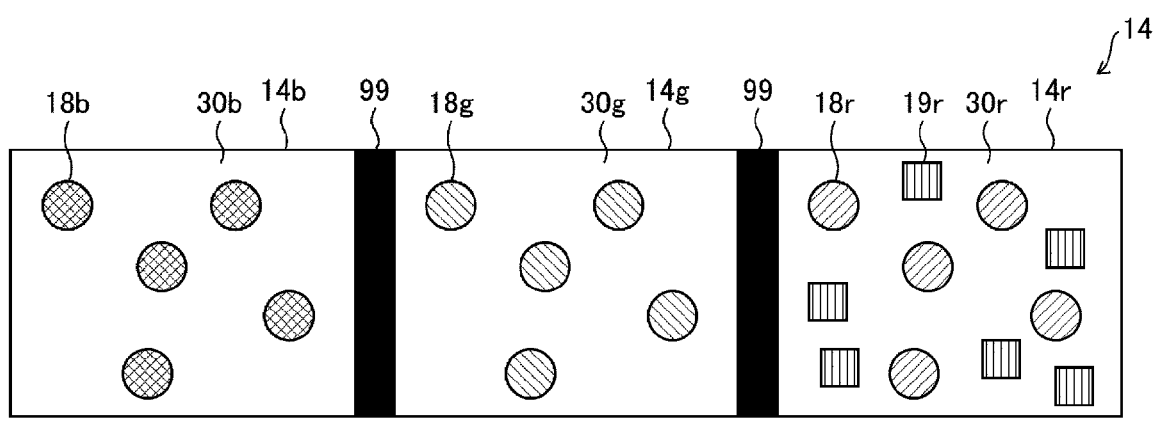
FIG. 4 is a cross-sectional view illustrating a detailed configuration of a light-emitting layer included in a light-emitting device of a second embodiment.

FIG. 4 is a cross-sectional view illustrating a detailed configuration of the light-emitting layer 14 according to the present embodiment.

In the embodiment 1, the green-light-emitting layer 14g of the green pixel Pg includes the thermally activated assist dopant 19g. In contrast, in the present embodiment, rather than the green-light-emitting layer 14g, the red-light-emitting layer 14r of the red pixel Pr includes the thermally activated assist dopant 19r.

Specifically, in the present embodiment, the red-light-emitting layer 14r includes a fluorescence dopant that emits red light, which serves as the light emission dopant 18r. The fluorescence dopant may be, for example, 4-(dicyanomethylene)-2-methyl-6-[2-(2,3,6,7-tetrahydro-1H,5H-benzo[ij]quinolizin-9-yl)vinyl]-4H-pyran (DCM2). In this case, the red light emitted by the red-light-emitting layer 14r exhibits a light emission spectrum having a peak at or near 630 nm.

In addition, in the present embodiment, the red-light-emitting layer 14r further includes a thermally activated assist dopant 19r. The thermally activated assist dopant may be, for example, 2,4,6-tri(4-(10H-phenoxazin-10H-yl)phenyl)-1,3,5-triazine (tri-PXZ-TRZ).

In a case where the red-light-emitting layer 14r includes the thermally activated assist dopant 19r, the host material 30r of the red-light-emitting layer 14r may be, for example, CBP. In this case, the mass ratio of the fluorescence dopant to the mass of the entire red-light-emitting layer 14r is preferably within a range of 0.1 wt. % or greater and 20 wt. % or less, and more preferably within a range of 0.5 wt. % or greater and 10 wt. % or less. More specifically, the mass ratio of the fluorescence dopant to the mass of the entire red-light-emitting layer 14r may be, for example, 1 wt. %. The mass ratio of the thermally activated assist dopant to the mass of the entire red-light-emitting layer 14r is preferably within a range of 0.5 wt. % or greater and 70 wt. % or less, and more preferably within a range of 1 wt. % or greater and 50 wt. % or less. More specifically, the mass ratio of the thermally activated assist dopant to the mass of the entire red-light-emitting layer 14r may be, for example, 15 wt. %.

On the other hand, in the present embodiment, the green-light-emitting layer 14g includes the phosphorescence dopant, which serves as the light emission dopant 18g. The phosphorescence dopant may be, for example, 3(tris(2-phenylpyridinato)iridium(III) Ir(ppy). In this case, the green light emitted by the green-light-emitting layer 14g exhibits a light emission spectrum having a peak at or near 520 nm.

In a case where the green-light-emitting layer 14g includes the phosphorescence dopant, the host material 30b of the green-light-emitting layer 14g may be, for example, 4,4'-di(N-carbazolyl)biphenyl (CBP). The mass ratio of the phosphorescence dopant to the mass of the entire green-light-emitting layer 14g may be, for example, 10 wt. %.

As described above, by including the thermally activated assist dopant 19r in the red-light-emitting layer 14r rather than in the green-light-emitting layer 14g, it is possible to achieve both the improvement in color reproducibility and the improvement in energy efficiency of the light-emitting device 1. In the present embodiment, since the blue-light-emitting layer 14b of the blue pixel Pb does not include the thermally activated assist dopant, a reduction in the life of the light-emitting device 1 is suppressed.

Third Embodiment

Figure 5:
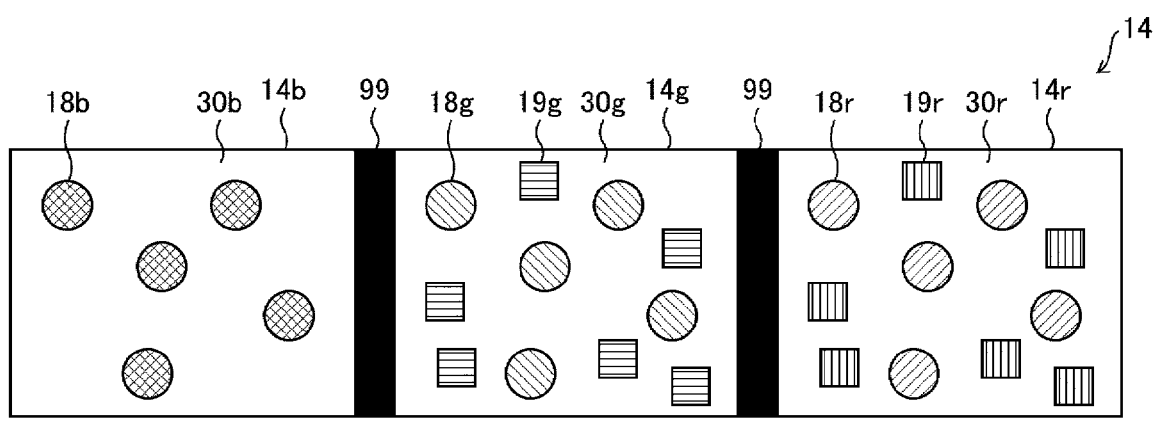
FIG. 5 is a cross-sectional view illustrating a detailed configuration of a light-emitting layer included in a light-emitting device of a third embodiment.

FIG. 5 is a cross-sectional view illustrating a detailed configuration of the light-emitting layer 14 of the present embodiment. In each of the first and second embodiments, only one of the green-light-emitting layer 14g and the red-light-emitting layer 14r includes the thermally activated assist dopant 19r or 19g. In the present embodiment, as illustrated in FIG. 5, the green-light-emitting layer 14g includes the thermally activated assist dopant 19g, and the red-light-emitting layer 14r includes the thermally activated assist dopant 19r.

The type of the thermally activated assist dopant 19g in the green-light-emitting layer 14g and the mass ratios of the fluorescence dopant and the thermally activated assist dopant to the mass of the entire green-light-emitting layer 14g may be the same as that described in the first embodiment. The type of the thermally activated assist dopant 19r in the red-light-emitting layer 14r and the mass ratios of the fluorescence dopant and the thermally activated assist dopant to the mass of the entire red-light-emitting layer 14r may be the same as that described in the second embodiment.

As described above, the green-light-emitting layer 14g and the red-light-emitting layer 14r include the thermally activated assist dopant 19g and the thermally activated assist dopant 19r respectively, and thus the color reproducibility of the light-emitting device 1 can be further improved, and the energy efficiency can be improved. In the present embodiment, since the blue-light-emitting layer 14b of the blue pixel Pb does not include the thermally activated assist dopant, a reduction in the life of the light-emitting device 1 is suppressed.

Fourth Embodiment

Figure 6:
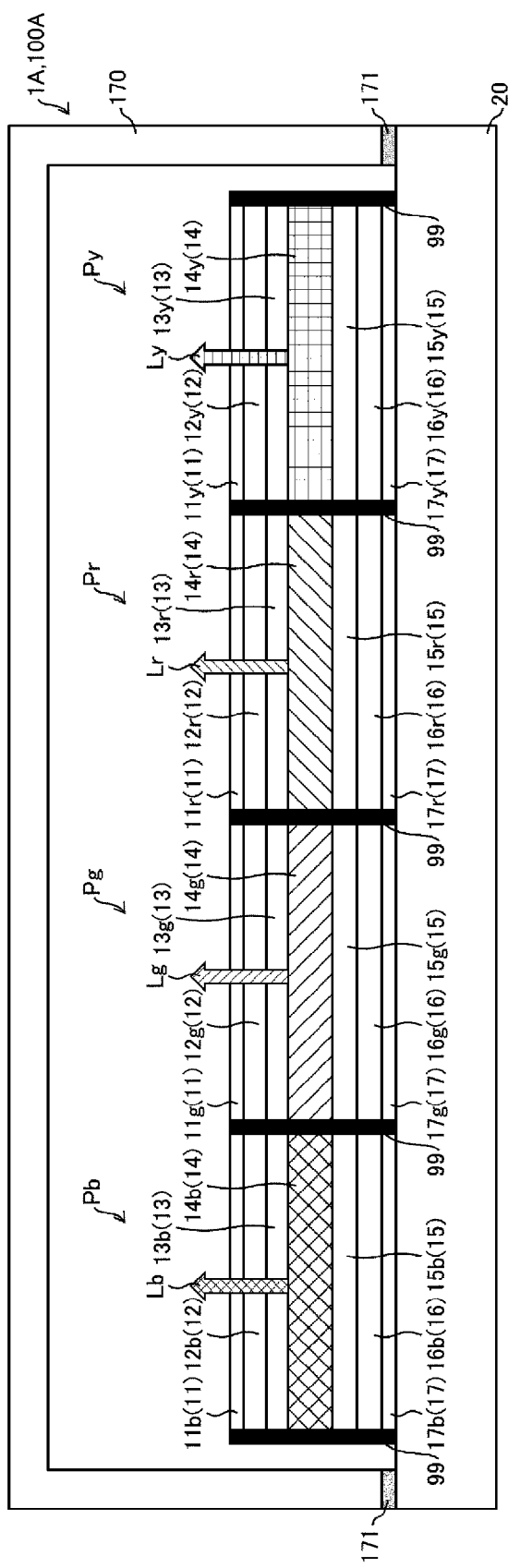
FIG. 6 is a cross-sectional view illustrating a schematic configuration of a light-emitting device of a fourth embodiment.

FIG. 6 is a cross-sectional view illustrating a detailed configuration of the light-emitting device 1A according to the present embodiment. The light-emitting device 1A is used as a light source of a display device 100A. That is, the display device 100A includes the light-emitting device 1A as a light source.

The light-emitting device 1A differs from the light-emitting device 1 of the first embodiment in that the light-emitting device 1A further includes a yellow pixel Py (Y pixel, fourth electroluminescence element) in addition to the blue pixel Pb (B pixel, first electroluminescence element), the green pixel Pg (G pixel, second electroluminescence element), and the red pixel Pr (R pixel, third electroluminescence element). The yellow pixel Py emits yellow light.

Figure 7:
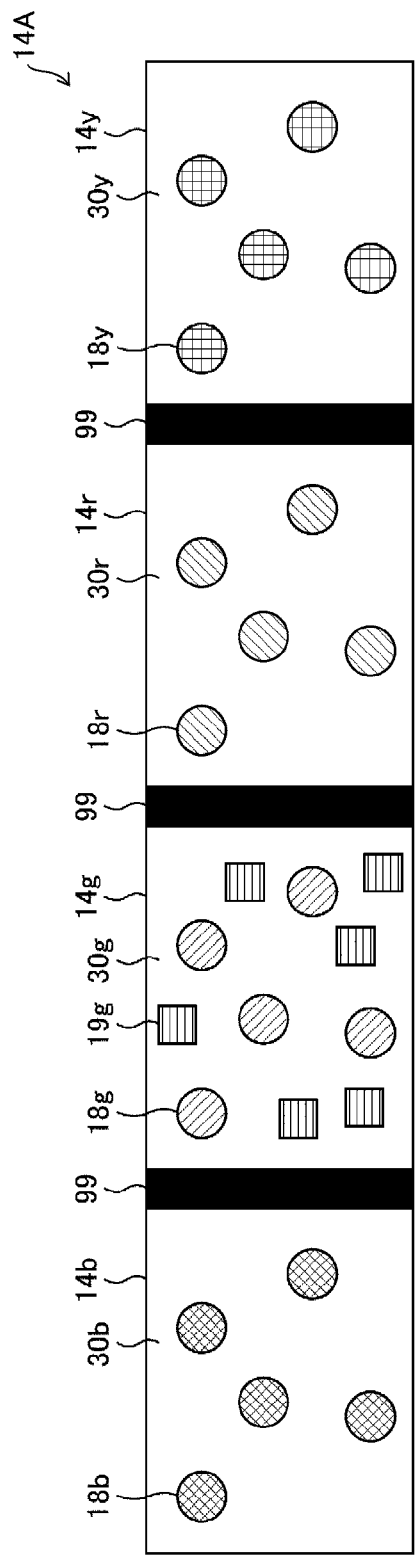
FIG. 7 is a cross-sectional view illustrating a detailed configuration of a light-emitting layer included in the light-emitting device of the fourth embodiment.

FIG. 7 is a view illustrating a configuration of a light-emitting layer 14A included in the light-emitting device 1A. As illustrated in FIG. 7, the light-emitting layer 14A further includes the yellow-light-emitting layer 14y in addition to the blue-light-emitting layer 14b, the green-light-emitting layer 14g, and the red-light-emitting layer 14r.

The yellow-light-emitting layer 14y includes a phosphorescence dopant that emits yellow light, which serves as the light emission dopant 18y. The phosphorescence dopant may be, for example, Bis(2-benzo[b]thiophen-2-ylpyridine) (acetylacetonate)iridium(III) (Ir(BT)2(acac)). In this case, the yellow light emitted by the yellow-light-emitting layer 14y exhibits a light emission spectrum having a peak at or near 580 nm.

The host material 30y of the yellow-light-emitting layer 14y may be, for example, CBP. Furthermore, the mass ratio of the phosphorescence dopant to the mass of the entire yellow-light-emitting layer 14y may be, for example, 10 wt. %. The light-emitting device 1A described above can also achieve both the improvement in color reproducibility and the improvement in luminous efficiency.

In the example illustrated in FIG. 7, only the green-light-emitting layer 14g includes the thermally activated assist dopant 19g in the light-emitting layer 14A. In the light-emitting layer 14A of the present embodiment, however, at least one of the green-light-emitting layer 14g, the red-light-emitting layer 14r, and the yellow-light-emitting layer 14y may include the thermally activated assist dopant, and all of the green-light-emitting layer 14g, the red-light-emitting layer 14r, and the yellow-light-emitting layer 14y may include the thermally activated assist dopant.

In a case where the yellow-light-emitting layer 14y includes the thermally activated assist dopant, the thermally activated assist dopant may be, for example, 2-phenoxazine-4,6-diphenyl-1,3,5-triazine (PXZ-TRX). In addition, in a case where the yellow-light-emitting layer 14y includes the thermally activated assist dopant, the yellow-light-emitting layer 14y includes a fluorescence dopant, which serves as the light emission dopant. The fluorescence dopant may be, for example, 2,8-di-tert-butyl-5,11-bis(4-tert-butylphenyl)-6,12-diphenyltetracene (TBRb). In this case, the yellow light emitted by the yellow-light-emitting layer exhibits a light emission spectrum having a peak at or near 570 nm.

In a case where the yellow-light-emitting layer 14y includes the thermally activated assist dopant, the host material 30y of the yellow-light-emitting layer 14y may be, for example, 3,3-di(9H-carbazol-9-yl)biphenyl (mCBP). The mass ratio of the fluorescence dopant to the mass of the entire yellow-light-emitting layer 14y is preferably within a range of 0.1 wt. % or greater and 20 wt. % or less, and more preferably within a range of 0.5 wt. % or greater and 10 wt. % or less. More specifically, the mass ratio of the fluorescence dopant to the mass of the entire yellow-light-emitting layer 14y may be, for example, 1 wt. %. Furthermore, the mass ratio of the thermally activated assist dopant to the mass of the entire yellow-light-emitting layer 14y is preferably within a range of 0.5 wt. % or greater and 70 wt. % or less, and more preferably within a range of 1 wt. % or greater and 50 wt. % or less. More specifically, the mass ratio of the thermally activated assist dopant to the mass of the entire yellow-light-emitting layer 14y may be, for example, 25 wt. %.

Comparative Example

Note that as a method for further improving color reproducibility and improving luminous efficiency, it is also conceivable that the blue-light-emitting layer 14b of the blue pixel Pb includes the thermally activated assist dopant. In this case, an example of the assist dopant includes 10-phenyl-10H,10'H-spiro[acridine-9,9'-anthracen]-10'-one (ACRSA).

However, when the inventors of the present application conducted the experiment for manufacturing a light-emitting device in which the blue-light-emitting layer 14b of the blue pixel Pb includes the thermally activated assist dopant such as the above-described ACRSA, for example, there was a problem in that the life of the blue pixel Pb was significantly shortened.

In contrast, in a case where the red-light-emitting layer 14r of the red pixel Pr and/or the green-light-emitting layer 14g of the green pixel Pg include the thermally activated assist dopant, there was no shortening of the life, which could be problematic in practical use of the light-emitting device 1. That is, with the red-light-emitting layer 14r and/or the green-light-emitting layer 14g including the thermally activated assist dopant and the blue-light-emitting layer 14b of the blue pixel Pb not including the thermally activated assist dopant, the light-emitting device 1 is possible to achieve both the improvement in the color reproducibility and the improvement in the luminous efficiency, and further to suppress the shortening of the life of the light-emitting device 1.

Specifically, particularly in a case where the blue-light-emitting layer 14b among the n electroluminescence elements includes the thermally activated assist dopant, the following problem may have occurred.

In general, the following photophysical processes take place until the light emission of the light-emitting device 1 provided with the light-emitting layer 14 including the thermally activated assist dopant. Specifically, electrons and holes respectively supplied from the cathode electrode 11 and anode electrode 17 are recombined by the thermally activated assist dopant to generate excitons with probabilities of 25% for singlet excitons and 75% for triplet excitons. In a case where the non-radiative deactivation rate constant of the triplet excitons is small, energies of the singlet excitons and the triplet excitons of the thermally activated assist dopant are close, and thus intersystem crossing from the triplet excitons to the singlet excitons occurs due to heat at about room temperature. Further, in a case where (i) the energies of the singlet excitons and the triplet excitons of the host material are greater than the energy of the triplet excitons of the thermally activated assist dopant, (ii) the distance between the thermally activated assist dopant and the fluorescence dopant is closer than about 10 nm, and (iii) the overlap between the light emission spectrum of the thermally activated assist dopant and the absorption spectrum of the fluorescence dopant is large, energy transfer occurs efficiently from the singlet excitons of the thermally activated assist dopant to the singlet excitons of the fluorescence dopant, and light is efficiently emitted from the fluorescence dopant.

Moreover, in a case where there is no host material, the distance between adjacent thermally activated assist dopants is close, and thus the probability of non-radiative deactivation (triplet-triplet deactivation) due to the interaction between the triplet excitons is high, and thus efficient light emission is not obtained. Thus, the host material is required for efficient light emission.

In addition, for efficient light emission, the energies of the singlet excitons and the triplet excitons of the host material are required to be greater than the energy of the triplet excitons of the thermally activated assist dopant. However, in a case where a host material having large energy gap is used, when holes and electrons are injected and transported from the anode electrode and the cathode electrode to the light-emitting layer and the thermally activated assist dopant, the holes are injected to and transported at the HOMO level of the host material and the electrons are injected to and transported at the LUMO level of the host material. As a result, a large external voltage is required to correspond to those large gaps, and the drive voltage increases.

For the above reason, in a case where the blue-light-emitting layer 14b includes the thermally activated assist dopant, the energies of the singlet excitons and the triplet excitons of the host material are required to be greater than the energies of singlet excitons and triplet excitons of the thermally activated assist dopant, in order to generate excitons corresponding to the blue energy gap by the thermally activated assist dopant, and the excitons are efficiently energy transferred to the fluorescent material to emit light. However, if the energy gap of the host material increases, the corresponding drive voltage also needs to be increased. Since blue is a high energy light compared to other colors (e.g. green or red), there has been a problem in that the drive voltage is higher than the case where other colors are emitted.

In addition, when the light-emitting device 1 is used in the display device 100, the drive voltage significantly increased compared to the drive voltage of the electroluminescence elements of other colors (e.g. green or red) makes the circuit design difficult. In addition, in the low luminance display of blue, there has been a problem in that the above drive voltage causes a phenomenon referred to as crosstalk (a phenomenon in which a current leaks into an adjacent light-emitting layer of another color to emit light whereas a voltage is applied to the blue device), in which the adjacent device of another color (for example, green or red) emits simultaneously.

Further, in the molecular design of the host material, conflicting designs, i.e., (i) the energies of the singlet excitons and the triplet excitons are greater than the energy of the singlet or the triplet excitons of the thermally activated assist dopant, and (ii) conjugated system is developed while being a small molecular structure for the design of the molecular structure with high charge transport performance, are required, which resulted in extreme difficulty.

In the host material having a large energy gap corresponding to blue and the thermally activated assist dopant, a radical anion or a radical cation state and an exciton state when transporting holes or electrons are high in energy compared to that of other colors (for example, green or red), and thus their activity is high, radical anions, radical cations, and excited state molecules are unstable, and these large energies also correspond to energy that cleaves the bond of a portion of the molecular structure of the host material or the thermally activated assist dopant, and thus there has been a problem in that the drive life of the display device (organic EL device) is short.

In contrast, in each of the above-described embodiments, since the blue-light-emitting layer 14b does not include the thermally activated assist dopant, it is possible to easily configure a high-performance light-emitting device and a display device that prevent the above-described various problems from occurring.

In the above-description, the cases were described in which the light-emitting devices 1 and 1A of each of the embodiments were applied to the display devices 100 and 100A, respectively. However, the devices to which the light-emitting devices 1 and 1A of the disclosure are applied are not limited to the display devices 100 or 100A, but may be, for example, an illumination device.

Supplement

A light-emitting device (1) according to a first aspect of the disclosure includes n (n is a natural number of 2 or greater) electroluminescence elements configured to emit lights having light emission spectra of peak wavelengths different from each other. Each of the n electroluminescence elements includes a light-emitting layer configured to emit light, the light-emitting layer includes a host material configured to transport carriers and a light emission dopant configured to contribute to the light emission, and m ($1 \leq m \leq n-1$) of then electroluminescence elements include, in the light-emitting layer, a fluorescence dopant configured to serve as the light emission dopant and, further include a thermally activated assist dopant composed of a thermally activated delayed fluorescent material.

According to the above configuration, m of the n electroluminescence elements include the fluorescence dopants having light emission spectra with sharp peaks, which serve as the light emission dopants. Further, the m electroluminescence elements include the thermally activated assist dopants, and thus the maximum internal quantum efficiency can be theoretically 100%. Accordingly, the m electroluminescence elements can achieve the light-emitting device having the high color reproducibility and the high luminous efficiency.

A light-emitting device according to a second aspect of the disclosure includes, at least a first electroluminescence element configured to emit blue light, a second electroluminescence element configured to emit green light, and a third electroluminescence element configured to emit red light as the electroluminescence elements. The light-emitting layer of one of the second electroluminescence element and the third electroluminescence element includes the fluorescence dopant and the thermally activated assist dopant and the light-emitting layer of the other of the second electroluminescence element and the third electroluminescence element includes a phosphorescence dopant configured to serve as the light emission dopant.

According to the above-described configuration, in the light-emitting device, the color reproducibility is high and the luminous efficiency is high in at least one of the electroluminescence element that emits green light and the electroluminescence element that emits red light. Thus, the color reproducibility is high and the luminous efficiency is high in the light-emitting device as a whole.

Furthermore, in the light-emitting device, the electroluminescence element that emits blue light does not include the thermally activated assist dopant. In the electroluminescence element including the thermally activated assist dopant, the life of the light emission dopant is shortened, and particularly the life of the light emission dopant that emits blue light is significantly shortened. Thus, since the electroluminescence element that emits blue light does not include the thermally activated assist dopant, the shortening of the life of the light-emitting device as a whole can be suppressed.

A light-emitting device according to a third aspect of the disclosure includes, at least a first electroluminescence element configured to emit blue light, a second electroluminescence element configured to emit green light, and a third electroluminescence element configured to emit red light as the electroluminescence elements. Each of the light-emitting layers of the second electroluminescence element and the third electroluminescence element includes the fluorescence dopant and the thermally activated assist dopant.

According to the above-described configuration, even higher color reproducibility and higher luminous efficiency can be achieved than the light-emitting device according to the second aspect.

A light-emitting device according to a fourth aspect of the disclosure includes at least a first electroluminescence element configured to emit blue light, a second electroluminescence element configured to emit green light, a third electroluminescence element configured to emit red light, and a fourth electroluminescence element configured to emit yellow light as the electroluminescence elements. The light-emitting layer of at least one of the second electroluminescence element, the third electroluminescence element, and the fourth electroluminescence element includes the fluorescence dopant and the thermally activated assist dopant, and the remaining light-emitting layers of the second electroluminescence element, the third electroluminescence element, and the fourth electroluminescence element include the phosphorescence dopants configured to serve as the light emission dopants.

According to the above-described configuration, the same effects can be achieved as of the second aspect.

A light-emitting device according to a fifth aspect of the disclosure includes, at least a first electroluminescence element configured to emit blue light, a second electroluminescence element configured to emit green light, a third electroluminescence element configured to emit red light, and a fourth electroluminescence element configured to emit yellow light as the electroluminescence elements. Each of the light-emitting layers of the second electroluminescence element, the third electroluminescence element, and the fourth electroluminescence element includes the fluorescence dopant and the thermally activated assist dopant.

According to the above-described configuration, the same effects can be achieved as of the third aspect.

According to the above-described configuration, in a case where the second electroluminescence element and/or the third electroluminescence element include the thermally activated assist dopants, the types and ratios of the assist dopants, the fluorescence dopants, and the host materials fall within the appropriate ranges. Thus, the luminous efficiency of the second electroluminescence element and/or the third electroluminescence element is particularly improved.

In a light-emitting device according to a sixth aspect of the disclosure, the light-emitting layer of the first electroluminescence element includes the fluorescence dopant configured to serve as the light emission dopant.

According to the above-described configuration, the first electroluminescence element emits light by the fluorescence dopant.

In a light-emitting device according to a seventh aspect of the disclosure, the light-emitting layer of the first electroluminescence element includes a Triplet-Triplet Annihilation (TTA) host material configured to serve as the host material.

According to the above-described configuration, in the first electroluminescence element, the host material generates one singlet exciton from two triplet excitons. Furthermore, the light emission as delayed fluorescence can be obtained from the singlet excitons of the fluorescence dopant by energy transfer from the host material to the fluorescence dopant.

In a light-emitting device according to an eighth aspect of the disclosure, the light-emitting layer of the first electroluminescence element includes the phosphorescence dopant configured to serve as the light emission dopant.

According to the above-described configuration, the first electroluminescence element can emit light by the phosphorescence dopant.

In a light-emitting device according to a ninth aspect of the disclosure, the mass ratio of the fluorescence dopant to the mass of the light-emitting layer including the thermally activated assist dopant is within a range of 0.1 wt. % or greater and 20 wt. % or less, and the mass ratio of the thermally activated assist dopant to the mass of the host material is within a range of 0.5 wt. % or greater and 70 wt. % or less.

A display device according to a tenth aspect of the disclosure includes the light-emitting device according to any one of the first to ninth aspects.

The disclosure is not limited to each of the embodiments described above, and various modifications may be made within the scope of the claims. Embodiments obtained by appropriately combining technical approaches disclosed in each of the different embodiments also fall within the technical scope of the disclosure. Moreover, novel technical features can be formed by combining the technical approaches disclosed in the embodiments.

The invention claimed is:

1. A light-emitting device comprising:
   n (n is a natural number of 2 or greater) electroluminescence elements configured to emit lights having light emission spectra of peak wavelengths different from each other,
   wherein each of the n electroluminescence elements includes a light-emitting layer configured to emit light,
   the light-emitting layer includes a host material configured to transport a carrier, and a light emission dopant configured to contribute to light emission, and
   m (1≤m≤n−1) of then electroluminescence elements include, in the light-emitting layer, a fluorescence dopant configured to serve as the light emission dopant, and further include a thermally activated assist dopant composed of a thermally activated delayed fluorescent material.

2. The light-emitting device according to claim 1, comprising:
   at least a first electroluminescence element configured to emit blue light, a second electroluminescence element configured to emit green light, and a third electroluminescence element configured to emit red light as the electroluminescence elements,
   wherein the light-emitting layers of one of the second electroluminescence element and the third electroluminescence element includes the fluorescence dopant and the thermally activated assist dopant, and
   the light-emitting layer of the other of the second electroluminescence element and the third electroluminescence element includes a phosphorescence dopant configured to serve as the light emission dopant.

3. The light-emitting device according to claim 2, wherein the light-emitting layer of the first electroluminescence element includes the fluorescence dopant configured to serve as the light emission dopant.

4. The light-emitting device according to claim 3, wherein the light-emitting layer of the first electroluminescence element includes a Triplet-Triplet Annihilation (TTA) host material configured to serve as the host material.

5. The light-emitting device according to claim 2, wherein the light-emitting layer of the first electroluminescence element includes the phosphorescence dopant configured to serve as the light emission dopant.

6. The light-emitting device according to claim 1, comprising:
at least a first electroluminescence element configured to emit blue light, a second electroluminescence element configured to emit green light, and a third electroluminescence element configured to emit red light as the electroluminescence elements,
wherein each of the light-emitting layers of the second electroluminescence element and the third electroluminescence element includes the fluorescence dopant and the thermally activated assist dopant.

7. The light-emitting device according to claim 1, comprising:
at least a first electroluminescence element configured to emit blue light, a second electroluminescence element configured to emit green light, a third electroluminescence element configured to emit red light, and a fourth electroluminescence element configured to emit yellow light as the electroluminescence elements,
wherein the light-emitting layer of at least one of the second electroluminescence element, the third electroluminescence element, and the fourth electroluminescence element includes the fluorescence dopant and the thermally activated assist dopant, and
the remaining light-emitting layers of the second electroluminescence element, the third electroluminescence element, and the fourth electroluminescence element include the phosphorescence dopant configured to serve as the light emission dopant.

8. The light-emitting device according to claim 1, comprising:
at least a first electroluminescence element configured to emit blue light, a second electroluminescence element configured to emit green light, a third electroluminescence element configured to emit red light, and a fourth electroluminescence element configured to emit yellow light as the electroluminescence elements,
wherein each of the light-emitting layers of the second electroluminescence element, the third electroluminescence element, and the fourth electroluminescence element includes the fluorescence dopant and the thermally activated assist dopant.

9. The light-emitting device according to claim 1, wherein a mass ratio of the fluorescence dopant to a mass of the light-emitting layer is within a range of 0.1 wt. % or greater and 20 wt. % or less, and
a mass ratio of the thermally activated assist dopant to a mass of the light-emitting layer including the thermally activated assist dopant is within a range of 0.5 wt. % or greater and 70 wt. % or less.

10. A display device comprising:
a plurality of the light-emitting devices according to claim 1.

* * * * *